US006444532B2

United States Patent
Hasegawa

(10) Patent No.: US 6,444,532 B2
(45) Date of Patent: Sep. 3, 2002

(54) PROCESS FOR FABRICATING MOS SEMICONDUCTOR TRANSISTOR

(75) Inventor: Masahiro Hasegawa, Fukuyama (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/883,368

(22) Filed: Jun. 19, 2001

(30) Foreign Application Priority Data

Jun. 28, 2000 (JP) ........................................ 2000-194455

(51) Int. Cl.[7] ............................................ H01L 21/336
(52) U.S. Cl. ..................... 438/303; 438/238; 438/239; 438/424; 438/433; 437/192; 437/193
(58) Field of Search ................................. 438/303, 238, 438/239, 424, 433; 437/192, 193

(56) References Cited

U.S. PATENT DOCUMENTS

| 5,270,232 A | * 12/1993 | Kimura et al. ................ 437/41 |
| 5,610,099 A | * 3/1997 | Stevens et al. ............. 437/192 |
| 5,710,073 A | * 1/1998 | Jeng et al. ................... 438/239 |
| 5,792,684 A | * 8/1998 | Lee et al. .................... 438/238 |
| 5,998,287 A | * 12/1999 | Huang ........................ 438/253 |

FOREIGN PATENT DOCUMENTS

JP 3-87060 4/1991

* cited by examiner

Primary Examiner—Richard Elms
Assistant Examiner—Pho M. Luu
(74) Attorney, Agent, or Firm—Nixon & Vanderhye P.C.

(57) ABSTRACT

A process for fabricating a MOS semiconductor transistor which includes a first oxide film on a semiconductor substrate and on a surface of a gate electrode formed on the semiconductor substrate with intervention of a gate insulating film, a nitride film on the first oxide film and a sidewall spacer of a second oxide film formed on a side of the gate electrode with intervention of the first oxide film and the nitride film, the process comprising the steps of: forming, on the nitride film, a photoresist mask which has an opening in a device formation region; implanting impurity ions through the nitride film and the first oxide film into the semiconductor substrate in a high concentration using the gate electrode, the sidewall spacer and the photoresist mask as a mask; selectively removing the sidewall spacer from the device formation region by wet etching; implanting impurity ions into the semiconductor substrate in a low concentration using the gate electrode and the photoresist mask as a mask, thereby forming an LDD structure; removing the photoresist mask; and thermally treating the resulting semiconductor substrate.

7 Claims, 2 Drawing Sheets

PROCESS FOR FABRICATING MOS SEMICONDUCTOR TRANSISTOR

CROSS-REFERENCE TO RELATED APPLICATION

This application is related to Japanese Patent Application No. 2000-194455 filed on Jun. 28, 2000, whose priority is claimed under 35 USC § 119, the disclosure of which is incorporated by reference in its entirety.

BACKGROUND OF THE INVENTION

1. Field of the Invention

The present invention relates to a process for fabricating a MOS semiconductor transistor, more particularly, a process for fabricating a MOS semiconductor transistor having an LDD structure.

2. Description of Related Art

A conventional process for fabricating a MOS semiconductor transistor having the LDD structure is explained with reference to FIGS. 2(a) to 2(d) (see Japanese Unexamined Patent Publication No. HEI 3(1991)-87060).

FIGS. 2(a) to 2(d) are schematic sectional views illustrating the conventional process for fabricating a device.

First, as shown in FIG. 2(a), a device isolation region 3 and a gate insulating film 4 are formed on a semiconductor substrate 1 of a first conductivity type. Next, a gate electrode 5 is formed of polycrystalline silicon, and the upper face and side faces of the gate electrode 5 are thermally oxidized to form a thermally oxidized film 6. Thereafter, a nitride film 7 is formed to a thickness of about 200 nm by a CVD method.

Next, as shown in FIG. 2(b), the nitride film 7 is anisotropically etched selectively to form a sidewall spacer 7a of the nitride film. Then, exposed surfaces of the gate electrode 5 and the semiconductor substrate 1 are thermally oxidized thinly to form a thermally oxidized film 6a. Thereafter, only a desired region is opened using a photoresist mask 8, and an impurity of a second conductivity type which is reverse to the conductivity type of the semiconductor substrate is implanted into the semiconductor substrate to form a high-concentration impurity layer 9.

Next, as shown in FIG. 2(c), the sidewall spacer 7a is isotropically etched out under the condition that the etching rate of the nitride film is sufficiently larger than the etching rate of the oxide film. Subsequently, an impurity of a second conductivity type is implanted in a low concentration to form a low-concentration impurity layer 10.

Next, as shown in FIG. 2(d), the photoresist mask 8 is removed, and the resulting semiconductor substrate is annealed, to complete the MOS semiconductor transistor of the LDD structure.

In the above-explained conventional process for fabricating a MOS semiconductor transistor having the LDD structure, the sidewall spacer is formed of a thick nitride film since the sidewall spacer needs to be selectively removed. However, the thick nitride film has a significantly large stress, and its formation damages the semiconductor substrate and deteriorates the characteristics of the transistor.

In addition, after the etching of the sidewall spacer, the thermally oxidized film 6a needs to be formed for protection of the surface of the gate electrode and the surface of the resulting semiconductor. This thermally oxidized film 6a is also formed thinly on the surface of the sidewall spacer formed of the nitride film. Accordingly, the thin oxide film needs to be removed prior to etching the nitride film at a high selective ratio. Further, the etching rate becomes low when the nitride film is dry-etched at a high selective ratio with respect to the oxide film. Therefore, productivity declines.

SUMMARY OF THE INVENTION

Accordingly, the present invention provides a process for fabricating a MOS semiconductor transistor which includes a first oxide film on a semiconductor substrate and on a surface of a gate electrode formed on the semiconductor substrate with intervention of a gate insulating film, a nitride film on the first oxide film and a sidewall spacer of a second oxide film formed on a side of the gate electrode with intervention of the first oxide film and the nitride film, the process comprising the steps of:

forming, on the nitride film, a photoresist mask which has an opening in a device formation region;

implanting impurity ions through the nitride film and the first oxide film into the semiconductor substrate in a high concentration using the gate electrode, the sidewall spacer and the photoresist mask as a mask;

selectively removing the sidewall spacer from the device formation region by wet etching;

implanting impurity ions into the semiconductor substrate in a low concentration using the gate electrode and the photoresist mask as a mask, thereby forming an LDD structure;

removing the photoresist mask; and thermally treating the resulting semiconductor substrate.

These and other objects of the present application will become more readily apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DESCRIPTION OF THE PREFERRED EMBODIMENTS

Figure 1A:
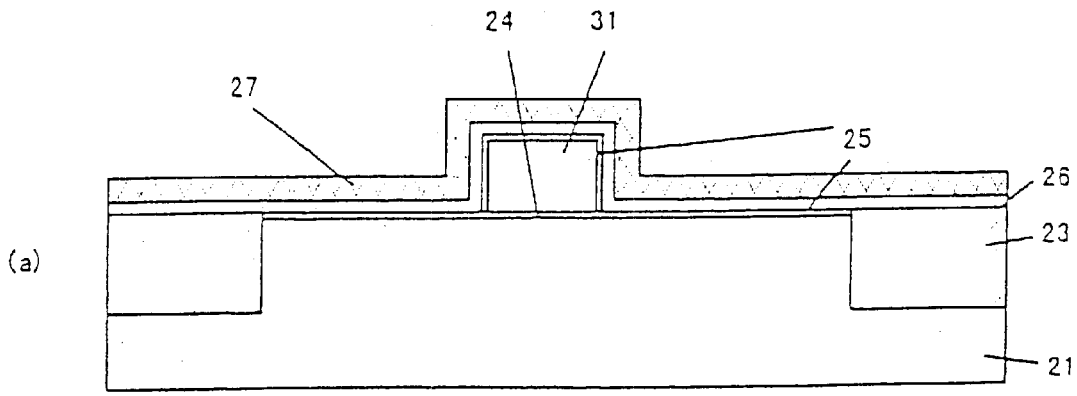
FIGS. 1(a) to 1(d) are schematic sectional views illustrating a process for fabricating a MOS semiconductor transistor in accordance with an example of the present invention.

The semiconductor substrate in the present invention may be any known substrate without any particular limitation. For example, a silicon substrate, a GaAs substrate and the like may be mentioned. The substrate may be of a P-type or N-type conductivity type. In the case where the semiconductor substrate is a silicon substrate, the P-type conductivity may be provided by P-type impurity such as boron or the like and the N-type conductivity may be provided by N-type impurity such as phosphorus, arsenic or the like. Also the semiconductor substrate may have a device isolation region of an LOCOS structure or an STI structure formed therein beforehand.

Next, the gate insulating film is formed on the semiconductor substrate. The gate insulating film may be formed of a silicon oxide film formed by using CVD or sputtering, a silicon nitride film formed by using CVD or sputtering, or a laminated film thereof. In the case where the semiconductor substrate is formed of silicon, the silicon oxide film may be formed by using thermal oxidation under $O_2$, NO, or $N_2O$ gas. The thickness thereof may preferably be about 3 to 15 nm in terms of the thickness of an oxide film.

Further, the gate electrode is formed on the gate insulating film. The gate electrode may be formed of a silicon film such as polysilicon, silicide or a laminate thereof (polycide) formed by CVD or the like, or a metal film of aluminum, copper or an alloy thereof formed by deposition. The thickness of the gate electrode may preferably be about 10 to 50 nm.

Next, the first oxide film is formed on the semiconductor substrate and the surface of the gate electrode. The first oxide film has the function of a buffer for the formation of the nitride film in the next step. In the case where the semiconductor substrate and the gate electrode are formed of silicon, the first oxide film may preferably be a silicon oxide film formed by using thermal oxidation. In the case where the semiconductor substrate and the gate electrode are formed of a material other than silicon, the first oxide film may be formed by CVD. The thickness thereof may preferably be about 5 to 10 nm.

Next, the nitride film is formed on the first oxide film. The nitride film may be a silicon nitride film formed by CVD. The thickness thereof may be 5 to 50 nm (preferably 5 to 10 nm). If the nitride film is thicker than 50 nm, it may damage the semiconductor substrate by distortion.

Next, the second oxide film is formed on the nitride film. The second oxide film may preferably be a silicon oxide film formed by CVD. The thickness thereof may preferably be about 50 to 200 nm.

Subsequently, the second oxide film is anisotropically etched selectively to form the sidewall spacer on the side of the gate electrode. At this etching, the nitride film functions as an etching stopper. Here, the ratio of the etching rate (selective ratio) of the second oxide film to the nitride film is preferably about 20 to 50.

Thereafter the photoresist mask is formed which has an opening in a desired device formation region.

Next, impurity ions are implanted through the nitride film and the first oxide film into the semiconductor substrate in a high concentration using the gate electrode, the sidewall spacer and the photoresist mask as a mask. As an impurity, may be mentioned the aforesaid N-type or P-type impurity. The ions may be implanted at an implantation energy of 30 to 80 KeV and a dose of $2\times10^{15}$ to $5\times10^{15}$ cm$^{-2}$, for example, when arsenic is implanted.

Next, the sidewall spacer is selectively removed from the device formation region by wet etching. At this wet etching, the nitride film functions as an etching stopper. Here, the selective ratio of the second oxide film to the nitride film may preferably be 100 or higher. Hydrofluoric acid and the like may be mentioned as an etchant used for the wet etching. According to the process of the present invention, the sidewall spacer can be removed in a removal speed of about one-tenth or less of the removal speed of the conventional dry etching. Therefore, the productivity improves.

Subsequently, for forming the LDD structure, impurity ions are implanted into the semiconductor substrate in a low concentration using the gate electrode and the photoresist mask as a mask. As an impurity, may be mentioned the aforesaid N-type or P-type impurity. The ions may be implanted at an implantation energy of 10 to 50 KeV and a dose of $1\times10^{14}$ to $3\times10^{14}$ cm$^{-2}$, for example, when phosphorus is implanted.

Thereafter, the photoresist mask is removed and the semiconductor substrate is thermally treated. This thermal treatment can activate the impurity implanted into the semiconductor substrate.

Through the above-described process, a MOS semiconductor transistor can be produced.

EXAMPLE

The present invention is now described in further detail by way of example with reference to the attached drawings, which should not be construed to limit the scope of the present invention.

FIGS. 1(a) to 1(d) are schematic sectional views illustrating a process for fabricating a MOS semiconductor transistor in accordance with an example of the present invention.

First, as shown in FIG. 1(a), a device isolation region 23 of the STI structure and a gate insulating film (ex. Silicon oxide film) 24 of 5 nm thickness are formed on an N-type semiconductor substrate (ex. Silicon substrate) 21. Next, a gate electrode 31 is formed of polycrystalline silicon or polycide. The upper surface and side face of the gate electrode 31 and the surface of the resulting semiconductor substrate 21 are oxidized to form a thermally oxidized film (the first oxide film) 25 of 5 nm thickness. Thereafter, a silicon nitride film 26 of about 10 nm thickness is formed, and an oxide film (the second oxide film) 27 of about 100 nm thickness is formed by CVD.

Figure 1B:
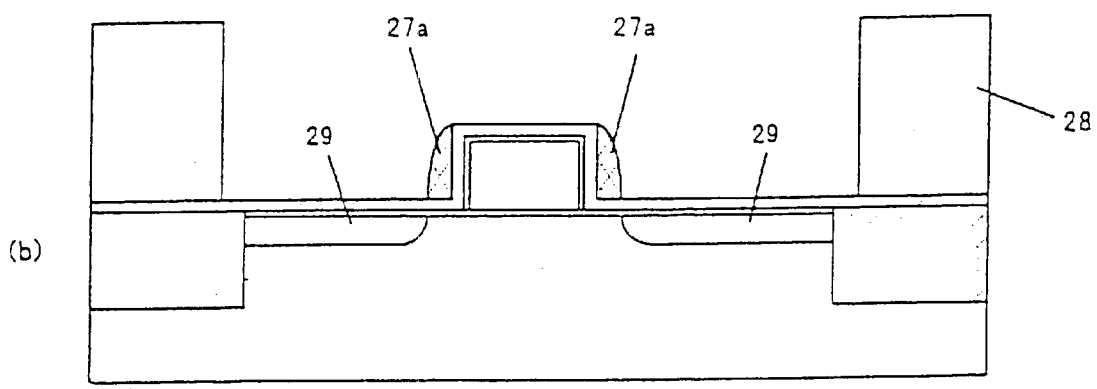

Next, as shown in FIG. 1(b), the oxide film 27 is anisotropically etched selectively, and thereby a sidewall spacer 27a is formed. At this time, since etching is stopped by the silicon nitride film, it is possible to avoid damage to the semiconductor substrate 21 which might be caused by the etching. Further, since the silicon nitride film 26 is so thin, the semiconductor substrate 21 and the gate insulating film 24 are not deteriorated by the stress of the film. Furthermore, since the sidewall spacer 27a is an oxide film formed by CVD, its stress is considerably small and does not impair the characteristics of the transistor finally produced.

Thereafter, a photoresist mask 28 is formed to have an opening at a region to be an NMOS. N-type ions, for example, arsenic ions, are implanted at an implantation energy of 40 KeV and a dose of 3E15/cm$^2$ to form a high-concentration N-type impurity layer 29.

Figure 1C:
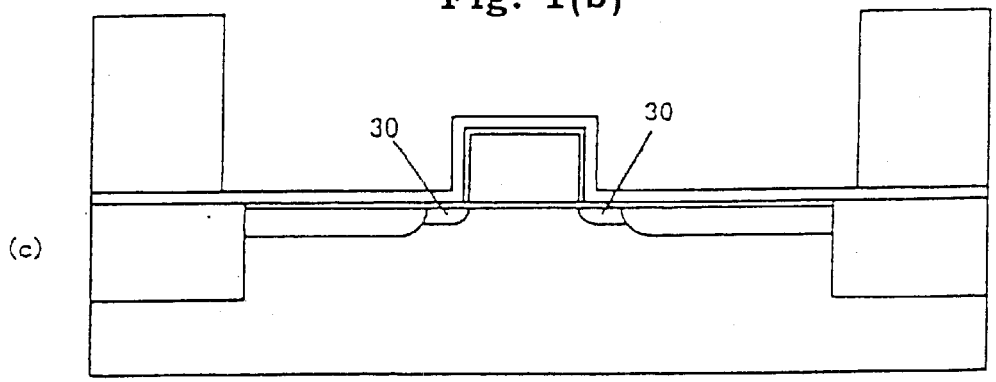

Subsequently, as shown in FIG. 1(c), the sidewall spacer 27a is selectively removed by means of hydrofluoric acid solution. The etching rate of the oxide film formed by CVD is about 50 nm/min. in a 0.5% hydrofluoric acid solution at the fastest. In contrast, the etching rate of the silicon nitride film is about 0.1 nm/min. Thus, a selective ratio of 500 or more can be obtained, which provide an excellent selectivity. In the case of the dry etching (reactive etching), the selective ratio is about 20. Further, in the case of the dry etching (reactive etching), treatment speed is about two minutes per substrate, but in the case of the wet etching of the present invention, the treatment speed is about 10 seconds per substrate. Therefore, the present invention is more excellent in productivity. Additionally, the dry etching can be performed both by batch processing and by single wafer processing, but the present invention is more excellent in productivity than both the processings.

Next, an N-type impurity, for example, phosphorus, is implanted at an implantation energy of 20 KeV and a dose of 2E14/cm$^2$ to form a low-concentration N-type impurity layer 30.

Figure 1D:
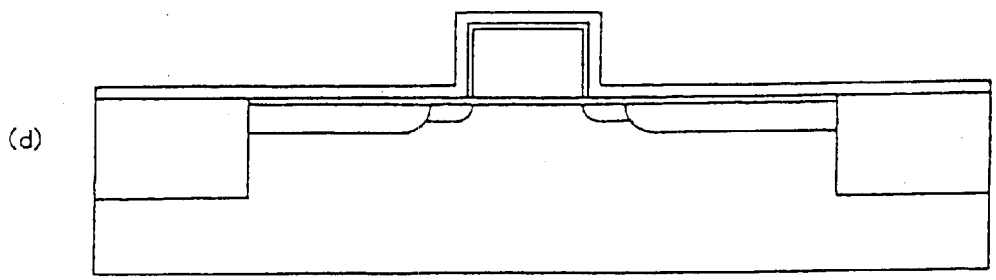
Figure 2A:
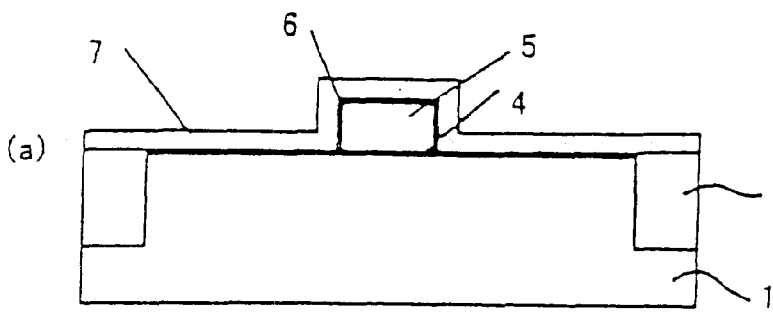
FIGS. 2(a) to 2(d) are schematic sectional views illustrating a conventional process for fabricating a MOS semiconductor transistor.
Figure 2B:
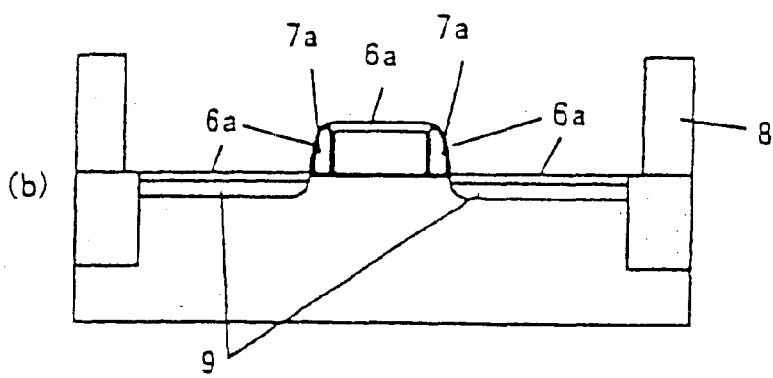
Figure 2C:
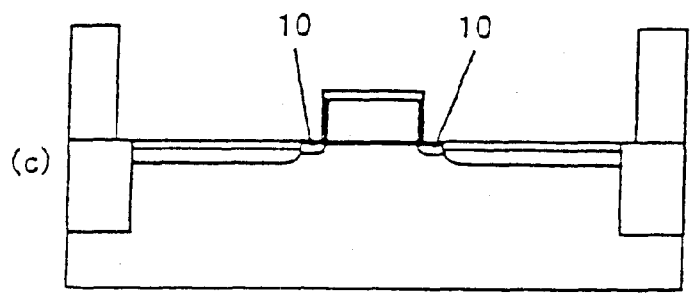
Figure 2D:
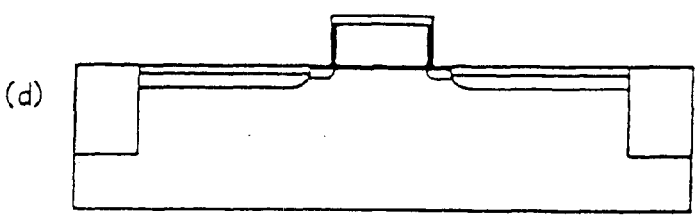

Subsequently, as shown in FIG. 1(d), the photoresist mask 28 is removed, and annealing is carried out to activate the high-concentration N-type impurity layer 29 and the low-concentration N-type impurity layer 30.

By the above-described process, an NMOS semiconductor transistor can be produced.

Likewise, it is also possible to produce a PMOS semiconductor transistor by forming a high-concentration P-type impurity layer and a low-concentration P-type impurity layer in a P-type semiconductor substrate. Furthermore, it is also possible to produce a CMOS semiconductor transistor by forming both the types (NMOS and PMOS) of transistors in the same wafer.

The process of fabricating a MOS semiconductor transistor having the LDD structure according to the present invention can provide a fabricating process exhibiting a high selectivity and a high-speed productivity in removing the sidewall spacer because the nitride film is used as a protective film for preventing the side of the gate electrode from being etched and the oxide film is used as the sidewall spacer. Also, the characteristics of the transistor can be prevented from deteriorating because the present invention provides a fabrication process causing a smaller stress on the substrate during film formation.

What is claimed is:

1. A process for fabricating a MOS semiconductor transistor, the method comprising:

forming a gate electrode on a semiconductor substrate with intervention of a gate insulating layer;

forming a first oxide film on a surface of the gate electrode;

forming a nitride film, over the first oxide film, on the gate electrode and the semiconductor substrate;

forming a sidewall spacer of a second oxide film on a side of the gate electrode with intervention of the first oxide film and the nitride film;

forming, on the nitride film, a photoresist mask which has an opening in a device formation region;

implanting impurity ions through the nitride film and the first oxide film into the semiconductor substrate in a high concentration using the gate electrode, the sidewall spacer and the photoresist mask as a mask;

selectively removing the sidewall spacer of the second oxide film from the device formation region by wet etching;

implanting impurity ions into the semiconductor substrate in a low concentration using the gate electrode and the photoresist mask as a mask, thereby forming an LDD structure;

removing the photoresist mask; and thermally treating the resulting semiconductor substrate.

2. The process according to claim 1, wherein a selective rate by the wet etching of the second oxide film to the nitride film is 100 or higher.

3. The process according to claim 1, wherein, in the case where the semiconductor substrate and the gate electrode are formed of silicon, and the first oxide film is a thermally oxidized film.

4. The process according to claim 1, wherein the second oxide film is formed by a CVD method.

5. The process according to claim 1, wherein the nitride film has a thickness of 5 to 10 nm.

6. The process according to claim 1, wherein the first oxide film has a thickness of 5 to 10 nm.

7. A process for fabricating a semiconductor transistor, the method comprising:

forming a gate electrode on a semiconductor substrate, forming a first oxide film on top and side surfaces of the gate electrode, forming a nitride film, over the first oxide film, on the top and side surfaces of the gate electrode, and also forming the nitride film on the semiconductor substrate, forming a sidewall spacer comprising a second oxide film on the side surface of the gate electrode with intervention of at least the first oxide film and the nitride film, forming, on the semiconductor substrate, a photoresist having an opening, implanting impurity ions through the nitride film and the first oxide film into the semiconductor substrate in a high concentration using the gate electrode, the sidewall spacer and the photoresist as a mask, selectively removing the sidewall spacer comprising the second oxide film from the gate electrode, implanting impurity ions into the semiconductor substrate in a low concentration using the gate electrode and the photoresist as a mask, thereby forming an LDD structure, removing the photoresist, and thermally treating the resulting semiconductor substrate.

* * * * *